United States Patent
Ivanovic et al.

(10) Patent No.: US 6,868,355 B2
(45) Date of Patent: *Mar. 15, 2005

(54) AUTOMATIC CALIBRATION OF A MASKING PROCESS SIMULATOR

(75) Inventors: Lav Ivanovic, Cupertino, CA (US); Paul Filseth, Los Gatos, CA (US); Mario Garza, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/829,408

(22) Filed: Apr. 20, 2004

(65) Prior Publication Data

US 2004/0199349 A1 Oct. 7, 2004

Related U.S. Application Data

(63) Continuation of application No. 10/305,673, filed on Nov. 26, 2002, now Pat. No. 6,768,958.

(51) Int. Cl.$^7$ .......................... G01P 21/00; G06F 19/00
(52) U.S. Cl. ....................................................... 702/94
(58) Field of Search ........................... 702/91, 94, 155, 702/167; 716/19, 21; 703/13, 21–23; 382/144, 199

(56) References Cited

U.S. PATENT DOCUMENTS

| | | | |
|---|---|---|---|
| 4,926,489 A | 5/1990 | Danielson et al. | 382/8 |
| 5,705,301 A | 1/1998 | Garza et al. | 430/5 |
| 6,078,738 A | 6/2000 | Garza et al. | 716/21 |
| 6,081,659 A | 6/2000 | Garza et al. | 716/21 |
| 6,768,958 B2 * | 7/2004 | Ivanovic et al. | 702/94 |
| 2002/0019729 A1 | 2/2002 | Chang et al. | 703/6 |
| 2003/0082463 A1 | 5/2003 | Laidig et al. | 430/5 |
| 2004/0057610 A1 * | 3/2004 | Filseth et al. | 382/144 |
| 2004/0120578 A1 * | 6/2004 | Grinchuk et al. | 382/199 |

* cited by examiner

Primary Examiner—Michael Nghiem
(74) Attorney, Agent, or Firm—Sawyer Law Group, LLP (57) ABSTRACT

A method and system is provided for automatically calibrating a masking process simulator using a calibration mask and process parameters to produce a calibration pattern on a wafer. A digital image is created of the calibration pattern, and the edges of the pattern are detected. Data defining the calibration mask and at least one of the process parameters are input to a process simulator to produce an alim image estimating the calibration pattern that would be produced by the masking process. The alim image and the detected edges of the digital image are then overlaid, and a distance between contours of the pattern in the alim image and the detected edges is measured. One or more mathematical algorithms are used to iteratively change the values of the processing parameters until a set of processing parameter values are found that produces a minimum distance between the contours of the pattern in the alim image and the detected edges.

30 Claims, 5 Drawing Sheets

Mask Design

FIG._4

SEM Image

AUTOMATIC CALIBRATION OF A MASKING PROCESS SIMULATOR

This is a continuation of application Ser. No. 10/305,673 filed Nov. 26, 2002, now U.S. Pat. No. 6,768,958.

FIELD OF THE INVENTION

The present invention relates to the field of semiconductor processing and more particularly to an improved process for automatically calibrating a masking process simulator.

BACKGROUND OF THE INVENTION

An integrated circuit is fabricated by translating a circuit design or layout to a semiconductor substrate. In optical lithography, the layout is first transferred onto a physical template, which is in turn used to optically project the layout onto a silicon wafer. In transferring the layout to a physical template, a mask is generally created for each layer of the integrated circuit design. The patterned photomask includes transparent, attenuated phase shifted, phase shifted, and opaque areas for selectively exposing regions of the photoresist-coated wafer to an energy source. To fabricate a particular layer of the design, the corresponding mask is placed over the wafer and a stepper or scanner machine shines a light through the mask from the energy source. The end result is a semiconductor wafer coated with a photoresist layer having the desired pattern that defines the geometries, features, lines and shapes of that layer. The photolithography process is typically followed by an etch process during which the underlying substrate not covered or masked by the photoresist pattern is etched away, leaving the desired pattern in the substrate. This process is then repeated for each layer of the design.

Ideally, the photoresist pattern produced by the photolithography process and the substrate pattern produced by the subsequent etch process would precisely duplicate the pattern on the photomask. For a variety of reasons, however, the photoresist pattern remaining after the resist develop step may vary from the pattern of the photomask significantly. Diffraction effects and variations in the photolithography process parameters typically result in critical dimension (CD) variation from line to line depending upon the line pitch of the surrounding environment (where pitch is defined for purposes of this disclosure as the displacement between an adjacent pair of interconnect lines). In addition to CD variation, fringing effects and other process variations can result in end-of-line effects (in which the terminal end of an interconnect line in the pattern is shortened or cut off by the photolithography process) and corner rounding (in which square angles in the photomask translate into rounded corners in the pattern). These three primary optical proximity effects, together with other photoresist phenomena such as notching, combine to undesirably produce a patterned photoresist layer that may vary significantly from the pattern of the photomask. In addition to variations introduced during the photolithography process, further variations and distortions are typically introduced during the subsequent etch process such that the pattern produced in the semiconductor substrate may vary from the photomask pattern even more than the photoresist pattern.

Conventional semiconductor process engineering in the areas of photolithography and etch typically attempts to obtain a finished pattern that approximates the desired pattern as closely as possible by controllably altering the process parameters associated with the various masking steps. Among the parameters process engineers typically attempt to vary in an effort to produce a photoresist pattern substantially identical to the photomask pattern include the intensity, coherency and wave length of the energy source, the type of photoresist, the temperature at which the photoresist is heated prior to exposure (pre-bake), the dose (intensity×time) of the exposing energy, the numerical aperture of the lens used in the optical aligner, the use of antireflective coatings, the develop time, developer concentration, developer temperature, developer agitation method, post bake temperature, and a variety of other parameters associated with the photolithography process. Etch parameters subject to variation may include, for example, process pressure and temperature, concentration and composition of the etch species, and the application of a radio frequency energy field within the etch chamber.

Despite their best efforts, however, semiconductor process engineers are typically unable to manipulate the photolithography and etch processes such that the photoresist and substrate patterns produced by the processes are substantially identical to the photomask pattern.

To avoid the time and cost of producing actual test wafers for every desired permutation of process parameters, computerized simulation of masking processes is employed to facilitate the optimization of a particular masking sequence and the generation of an optical proximity correction (OPC) distorted photomask. Masking process simulators receive various inputs corresponding to the parameters of the photoresist and etch processes to be simulated and attempt to simulate the pattern that will be produced by the specified masking process given a particular photomask. Accordingly, computerization has significantly enhanced the process engineer's ability to characterize and optimize masking processes.

Nevertheless, it is typically impossible to adequately account for the multitude of parameters associated with a masking process despite the effort devoted to masking process characterization, the introduction of optical proximity correction techniques, and the emergence of sophisticated process simulation software. In other words, simulation programs are ultimately unable to account for the various parametric dependencies in a manner sufficient to predict the exact pattern that will be produced by any particular masking process and mask.

Accordingly, what is needed is a method and system for improving the prediction accuracy of masking process simulator software. The present invention addresses such a need.

SUMMARY OF THE INVENTION

The present invention provides a method and system for improving the prediction accuracy of masking process simulators through automatic calibration of the simulators. The method and system include performing a masking process using a calibration mask and process parameters to produce a calibration pattern on a wafer. A digital image is created of the calibration pattern, and the edges of the pattern are detected from the digital image using pattern recognition. Data defining the calibration mask and the process parameters are then input to a process simulator to produce an alim image estimating the calibration pattern that would be produced by the masking process. The method and system further include overlaying the alim image and the detected edges of the digital image, and measuring a distance between contours of the pattern in the alim image and the detected edges. Thereafter, one or more mathematical algorithms are used to iteratively change the values of the processing parameters input to the simulator until a set of processing parameter values are found that produces a minimum distance between the contours of the pattern in the alim image and the detected edges.

According to the method and system disclosed herein, the calibration effectively calibrates the process simulator to compensate for process variations of the masking process. Once the calibration is performed and actual mask data and the modified process parameters are input to the process simulator, the process simulator will produce an image that varies minimally from the actual pattern produced by the masking process.

DETAILED DESCRIPTION OF THE INVENTION

The present invention relates to simulating semiconductor fabrication processes and a method for improving process simulators through automatic calibration. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
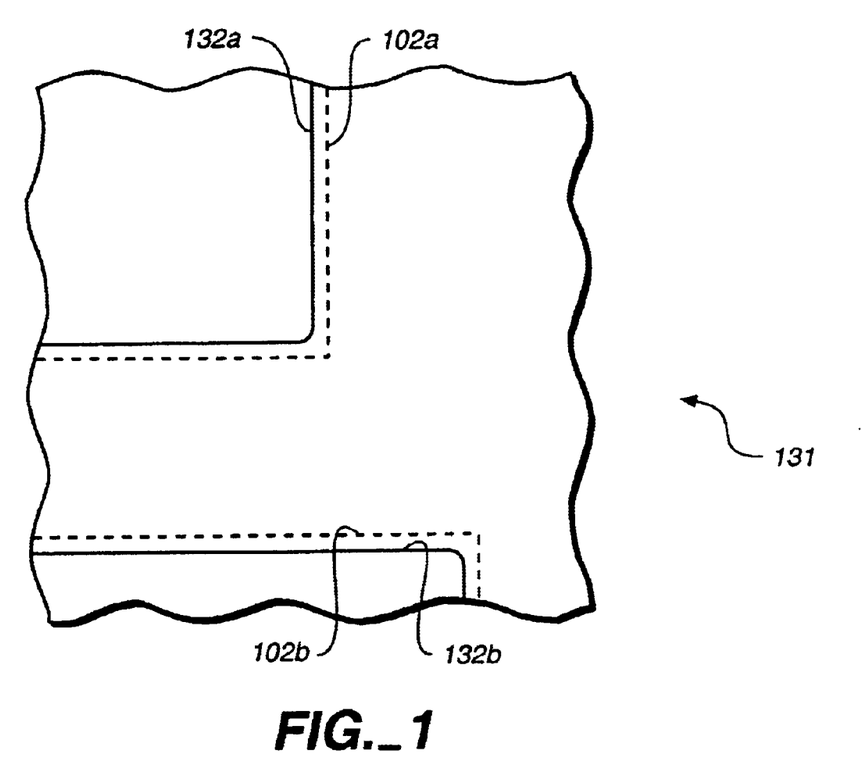
FIG. 1 is a diagram showing a portion of a desired semiconductor pattern and the patterned layer resulting from the masking process.

Referring now to FIG. 1 a portion of a desired semiconductor pattern and the patterned layer resulting from the masking process is shown. The semiconductor pattern shown in dashed lines includes various pattern elements 102a, and 102b (collectively referred to as pattern elements 102). Using the pattern, a masking process is used to create the patterned layer 131, comprising the actual elements 132. The patterned layer 131 may comprise, in alternative embodiments, a photoresist pattern produced by a photolithography process or a substrate pattern produced by an etch process.

As will be appreciated to those skilled in the art of semiconductor processing and design, elements 102 of semiconductor pattern includes various interconnect sections and pattern elements designed to achieve a desired function when the integrated circuit contemplated by the semiconductor fabrication process is completed. Typical elements 102 of a semiconductor pattern are substantially comprised of straight lines and square corners. For a variety of reasons, reproducing the exact image of semiconductor pattern in a production process is extremely complicated due to the large number of parameters associated with typical masking processes and further due to the unavoidable diffraction effects which inevitably result in some variations between the photomask used to produce a pattern and the pattern itself.

It is seen in FIG. 1 that the actual pattern 131 produced by a masking process varies from the desired semiconductor pattern 102. This discrepancy is shown in FIG. 1 as the displacement between the dashed lines of pattern elements 102a and 102b and the actual pattern elements 132a and 132b. Typically, the variations from the idealized pattern 102 include rounding of the corners and a shrinking of the line widths. It will be appreciated to those skilled in the art of semiconductor processing that variations from the desired semiconductor pattern can contribute to lower processing yields, reduced reliability, reduced tolerance to subsequent misalignment, and other undesired effects.

As is well-known in the art, commercial masking process simulation software is available that is capable of producing a simulated estimate of the pattern that would be produced by a specified masking process using a given photomask. Examples of process simulation software include TSUPREM-4™ and Taurus-LRC™ by Synopsys, Inc. of Mountain View, Calif. Masking process simulators are useful for generating a large quantity of information concerning the effects of modifying various parameters associated with the process. Simulation is necessary to avoid the time and expense associated with producing actual test wafers for each proposed parameter modification.

Ultimately, the simulator will produce an estimate of the pattern, referred to as an aerial or latent image, that varies from the actual pattern produced by the masking process (due to diffraction effects and variations in the masking process) regardless of the number of parameters incorporated into the simulator.

The Assignee of the present application has developed a process that improves the process simulator's prediction of the final pattern produced by a masking process by using the actual results obtained generated by the masking process. For example, U.S. Pat. Nos. 6,078,738 and 6,081,659, which are hereby incorporated by reference, discloses a process that introduces a feedback mechanism into the simulation process whereby the discrepancies observed between the actual pattern and the aerial image are analyzed to produce a modified simulator that results in less discrepancy, or error between the aerial image produced during a successive iteration of the simulator and the actual image produced by the pattern.

Using the actual results obtained by the masking process to improve the prediction accuracy of the process simulator program can be referred to as a calibration process. However, how the calibration is implemented, including how the simulator is modified based on the calibration, can significantly affect the performance of the simulator.

One approach for modifying the simulator during the calibration is a manual process whereby an operator iteratively changes the process parameter values input to the simulator by hand until the simulator achieves a desired level of performance. It is difficult, however, for the operator to change more than a couple of the processing parameter at a time, making the process tedious, error prone, and time-consuming.

Another calibration approach uses critical dimension checking whereby a critical dimension of a particular feature of the actual pattern produced by the masking process is measured directly from a production wafer. The same critical distance is also measured across the feature in the aerial image produced by simulator. The processing parameters input to the simulator are then changed using an exhaustive search algorithm until the simulator produces an aerial image that has a critical distance equal to that of the actual pattern. One disadvantage of this method is that the critical dimension typically measures a feature in one dimension only, typically horizontally or vertically across the middle of the feature. The process, therefore, is incapable of analyzing the pattern in areas where most stepper errors occur, such as the ends of lines and the spaces between features.

Accordingly, the present invention provides an improved process for analyzing the difference between the aerial image produced by a simulator and the actual pattern produced by the masking process in order to provide an improved method for calibrating the simulator. According to the present invention, calibration mask data and process parameters are input to a process simulator to produce an aerial image estimating the calibration pattern that would be produced by a masking process. The same calibration mask data and process parameters are used during the masking process to produce an actual calibration pattern on a wafer. A digital image of the actual pattern on the wafer is obtained, preferably using a scanning electron microscope (SEM). The edges of the pattern are automatically recognized from the SEM image using pattern recognition, and the recognized edges of the actual pattern are superimposed with the pattern in the aerial image. The distance between the contours of the pattern in the aerial image and the countours of the SEM edges is then measured, providing a distance value that is based on two dimensions, rather than one. One or more mathematical algorithms are then used to iteratively change the values of processing parameters input to the simulator until a set of processing parameter values are found that produces a minimum distance between the aerial image contours and SEM edges. This new set of parameters effectively calibrate the process simulator to compensate for process variations of the masking process.

Once the calibration is performed and an operator inputs actual mask data and the modified process parameters into the process simulator, the process simulator will produce an aerial image that varies minimally from the actual pattern produced by the masking process. The calibrated process simulator may be used for a variety of tasks including predicting mask defects, as a model for OPC correction, for phase shifting mask correction, and so on.

Figure 2A:
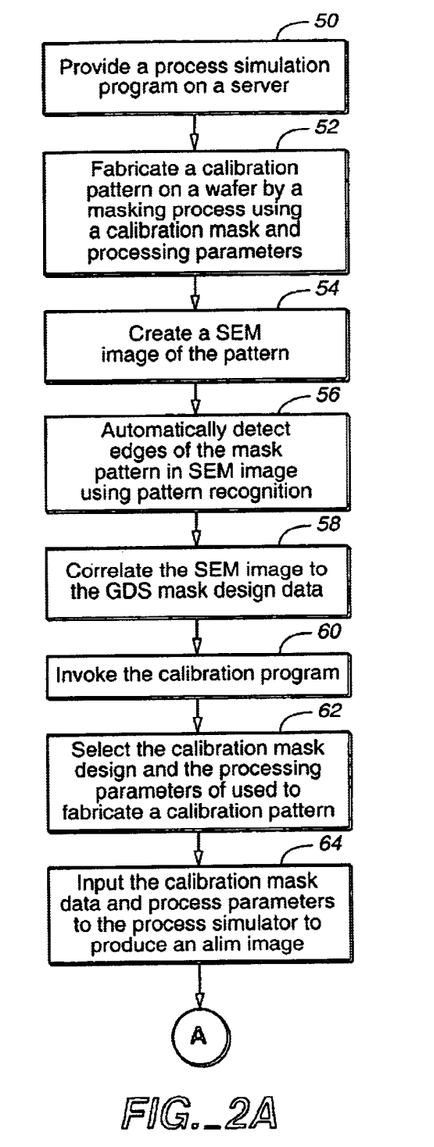
FIGS. 2A and 2B are flow charts illustrating a process for calibrating a process simulator to compensate for process variations of the masking process in accordance with a preferred embodiment of the present invention.
Figure 2B:
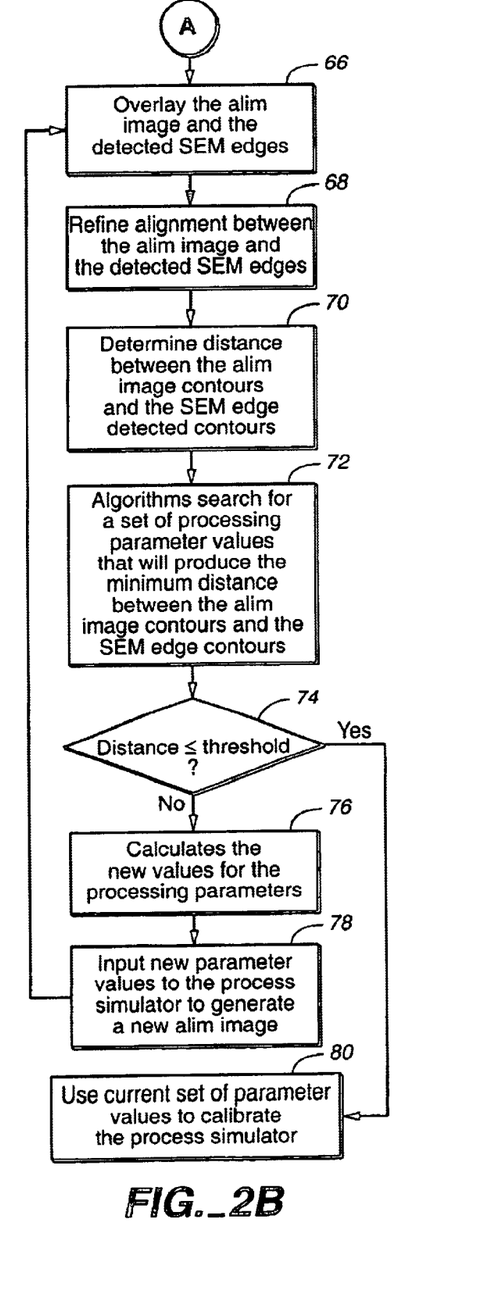

FIGS. 2A and 2B are flow chart illustrating a process for calibrating a process simulator to compensate for process variations of the masking process in accordance with a preferred embodiment of the present invention. The process begins in step 50 by providing a process simulation program that operates in accordance with the present invention on a server, and making the program available over a network, such as the Internet.

Figure 3:
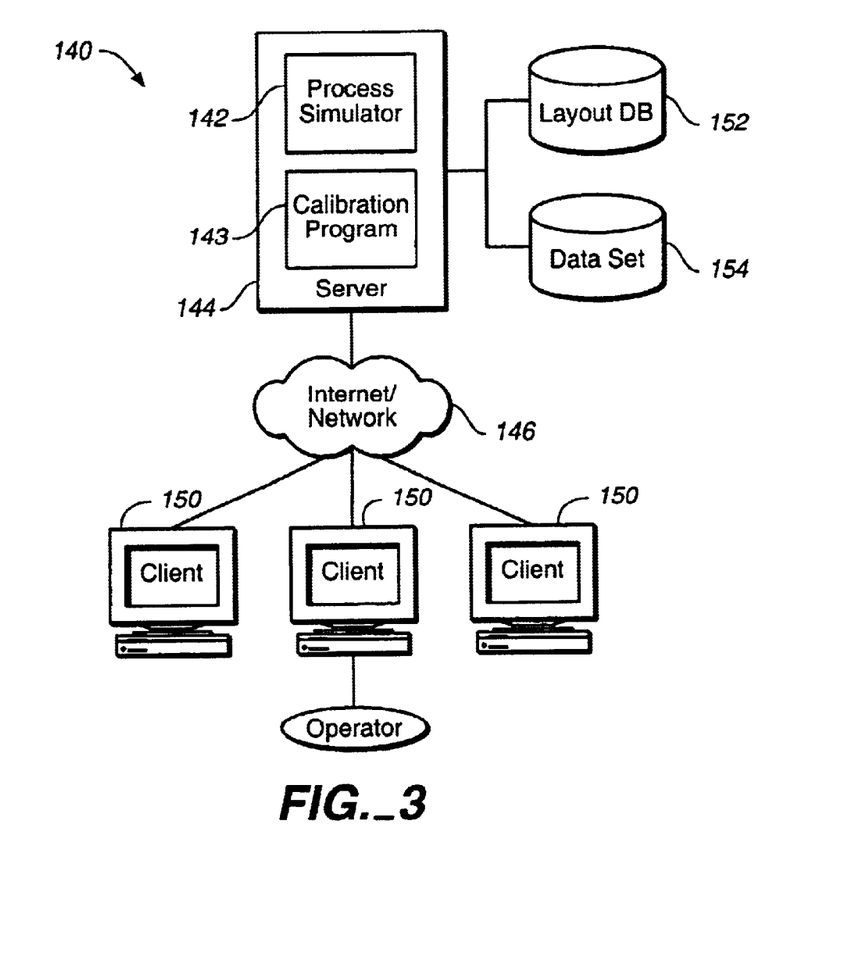
FIG. 3 is a block diagram of a web-enabled process simulation system in a preferred embodiment of the present invention.

FIG. 3 is a block diagram of a web-enabled process simulation system in a preferred embodiment of the present invention. The simulation system 140 includes a process simulator 142 and an automatic calibration program 143 for calibrating the process simulator 142. The process simulator 142 and the automatic calibration program 143 are executed on a server 144 as application programs and accessed over a network 146 by one or more operators using client computers 150. The automatic calibration program 143 may be included as part of, or separate from the process simulator 142.

Figure 4:
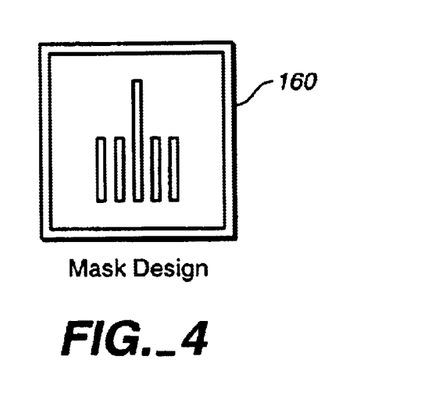
FIG. 4 is an illustration of an example calibration mask pattern.

The process simulator 142 and calibration program 143 are capable of accessing one or more mask layout databases 152, each of which includes a set of mask designs that will be used to fabricate a particular semiconductor device. In particular, the calibration process 143 typically accesses a calibration mask design (not shown) when calibrating the process simulator 142. The process simulation system 140 also includes a data set 154 defining the input processing parameters, as described below. FIG. 4 is an illustration of an example calibration mask pattern from the mask layout database 152. In a preferred embodiment, mask data is stored in GDSII format.

Referring again to FIG. 2, a calibration pattern is fabricated on a wafer by a masking process in step 52 whereby a physical calibration mask and a stepper machine are used to generate the calibration pattern under the conditions specified by the data set 154. The data set 154 includes global processing parameters that are associated with the masking process. In a preferred embodiment, the global processing parameters include both resist parameters for simulating the photoresist, and optical parameters for simulating the optics and characteristics of stepper machine.

As is well known to those skilled in the field of photolithography engineering, examples of resist parameters include resist contrast (gamma), resist thickness, resist sensitivity, resist solids content, and resist viscosity. Examples of the optical parameters that may affect the resist image include the intensity of the stepper lamp, the duration of the exposure, the coherency of the optical energy, the aperture of lenses, and the wavelength of the lamp source. It will be further appreciated to those skilled in the art, that the develop process and the etch process both include a number of parameters that may also be input to the process simulator 142, such as develop time, developer concentration, developer temperature, developer agitation method, and any post bake time and temperature. Etch parameters may include, for example, etch temperature, etch pressure, and etchant composition and concentration. The process parameters described above are meant to be illustrative rather than exhaustive and additional parameters may be incorporated into the simulator 142.

Figure 5:
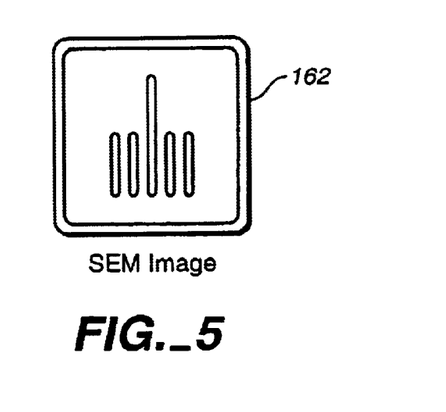
FIG. 5 is an illustration of an example SEM image produced by the masking process using the mask design shown in FIG. 4.

After the physical calibration pattern is fabricated by the masking process, a scanning electron microscope (SEM) is used to create a digital representation of the pattern, referred to herein as an SEM image in step 54. FIG. 5 is an illustration of an example SEM image produced by the masking process using the mask design shown in FIG. 4.

Referring again to FIG. 2, according to one aspect of the present invention, in step 56, the edges of the mask pattern in the SEM image are automatically detected using pattern recognition. The detected edges may be stored in an edge database in a standard format, such as GDSII (a standard file format for transferring/archiving to the graphic design data). In one preferred embodiment, an algorithm, referred to as a Snake Algorithm, is used to automatically detect the mask edges from the SEM image, as disclosed in U.S. patent application Ser. No. 10/251,082 entitled "Mask Defect Analysis for Both Horizontal and Vertical Processing Effects" (2513P) filed on Sep. 20, 2002 by the present assignee and herein incorporated by reference. In an alternative embodiment, an "Adaptive SEM Edge Recognition Algorithm" may also be used to detect the edges, as disclosed in U.S. Ser. No. 10/327,452, entitled "Adaptive SEM Edge Recognition Algorithm," filed on December 2002.

In step 58, the SEM image is correlated to the GDS mask design data layout database 152 in order to determine how many pixels in the SEM image are equal to one unit of measure of the mask design, which is typically nanometers.

In step 60, an operator of a client computer 150 invokes the calibration program 143. In step 62, the operator selects the calibration mask design and the data set 154 representing global processing parameters of the masking process that were used to fabricate a calibration pattern.

In step 64, the calibration mask data and process parameters are input to the process simulator 142 to produce an image estimating the calibration pattern that would be produced by a masking process. As is well-known in the art, an aerial or latent image may be produced by the simulator, which are collectively referred to herein as an "alim" image (aerial/latent image). The alim images generated by the process simulator 142 may be stored either on a server, or on the client computer 150.

Figure 6:
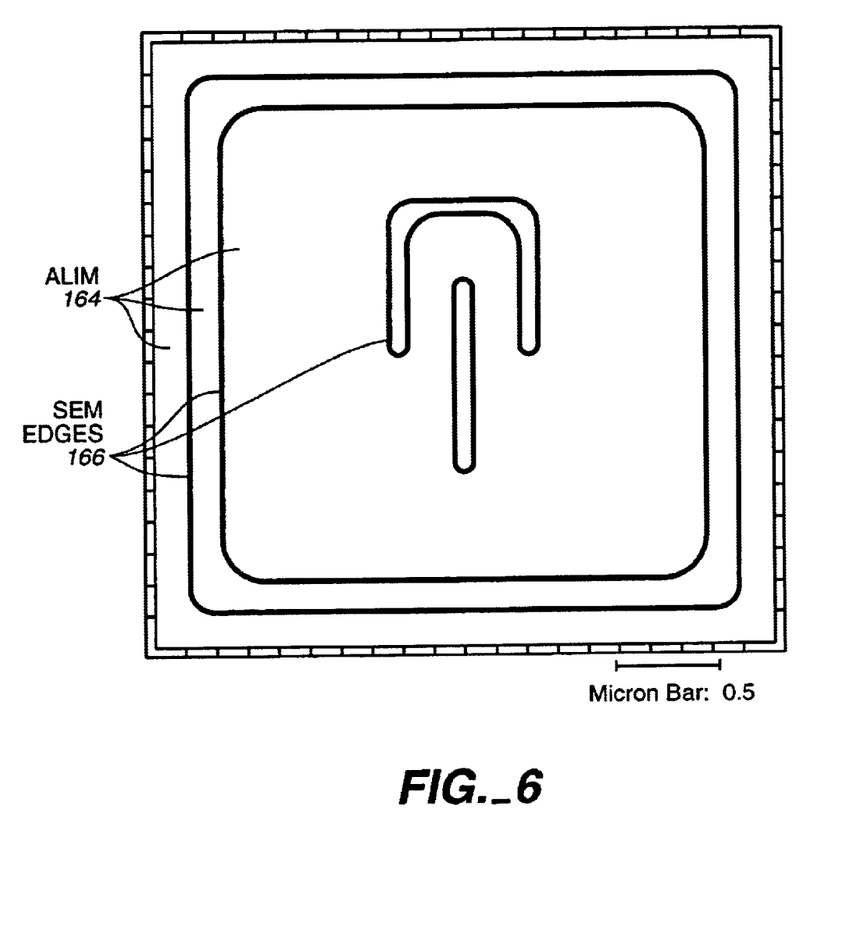
FIG. 6 is a diagram showing an alim image superimposed with the detected SEM edges.

In step 66, the alim image, the calibration mask design, and the detected SEM edges are overlaid. In step 68, the alignment between the alim image, the calibration mask, and the detected SEM edges are refined. In a preferred embodiment, the alim image and the pattern in the SEM image may include corresponding alignment marks to facilitate a subsequent alignment and comparison. The overlaid images may optionally be displayed to the operator. FIG. 6 is a diagram showing an example alim image 164, shown with white lines, superimposed with the detected SEM edges, shown with dark lines.

Referring again to FIG. 2, in step 70, the distance between the alim image contours and the detected SEM edges are determined. In a preferred embodiment, this distance is determined using a root mean square (RMS) algorithm. The RMS algorithm measures the distance between each pair of corresponding edges in the alim image 164 and the SEM image 166 (or a subset of the edges) and applies a weighted average to the measured distances to produce a single distance value. In another preferred embodiment, the weighted average is equal to an Nth root of an average Nth power of distance between the SEM edges and the alim image for some N not necessarily equal to 2. Calculating distances between the contours in this manner effectively provides a distance value that is based on two-dimensional measurements.

In step 72, one or more mathematical algorithms are used to search for a set of processing parameter values for input to the simulator that will produce the minimum distance between the alim image contours and the SEM edges. The operator may also define a minimum distance threshold that will be used to terminate the search, and the minimum and maximum possible values for the processing parameters.

In a preferred embodiment, a subset of the processing parameters used by the masking process are input to the mathematical algorithm. According to the present invention, the following 11 processing parameters are used to determine the minimum distance: focus, diffusion, sigma in, sigma out, angle of the pole location, numerical aperture, sigma of the pole, spherical, coma_x, coma_y, and intenstity contour.

In step 74, it is determined if the calculated distance between the alim image contours and the SEM edges meets the minimum distance threshold set by the operator. The minimum distance threshold is dependent upon the particular process technology being used. For a 130 nm process technology, for example, the minimum distance threshold may be set at 8–10 nm, which means that the process simulator must produce an alim image 164 that is within 10% of an SEM image 166. For critical applications, an error threshold of 5% or less may be necessary.

If the calculated distance does not meet the minimum distance threshold, then the algorithm calculates new values for the processing parameters in step 76. The new processing parameter values are calculated during the process of minimizing the distance between the alim image contours and the SEM edge contours given a function (f) of the 11 variables (x):

$$f(x_1, \ldots, x_{11})/R^{11} - R$$

In a preferred embodiment, two algorithms are employed to minimize this equation. First, a well-known stochastic algorithm is used to iteratively change the processing values until a global minimum for the function is found. This first set of calculated parameter values that produce the global minimum are then input to a second well-know algorithm, referred to as a simplex or Powell algorithm. This algorithm begins with the function defined by this set of parameter values and iteratively changes the values of the parameters until local minimums within the function are found, producing a second set of parameter values.

In step 78, this second set of calculated parameter values are input to the process simulator 142 to generate a new alim image 164, and the process continues with steps 66–72. The alim image 164 is overlaid with the SEM edges and the distance between the two are calculated, etc. If the calculated distance between the alim image contours and the SEM edge contours does not meet the minimum distance threshold in step 74, then the process continues. If the calculated distance between the alim image contours and the SEM edge contours meets the minimum distance threshold in step 74, then in step 80 the current set of parameter values are the optimal set of parameters and are output by calibration program 143 for calibration of the process simulator 142.

Figure 7:
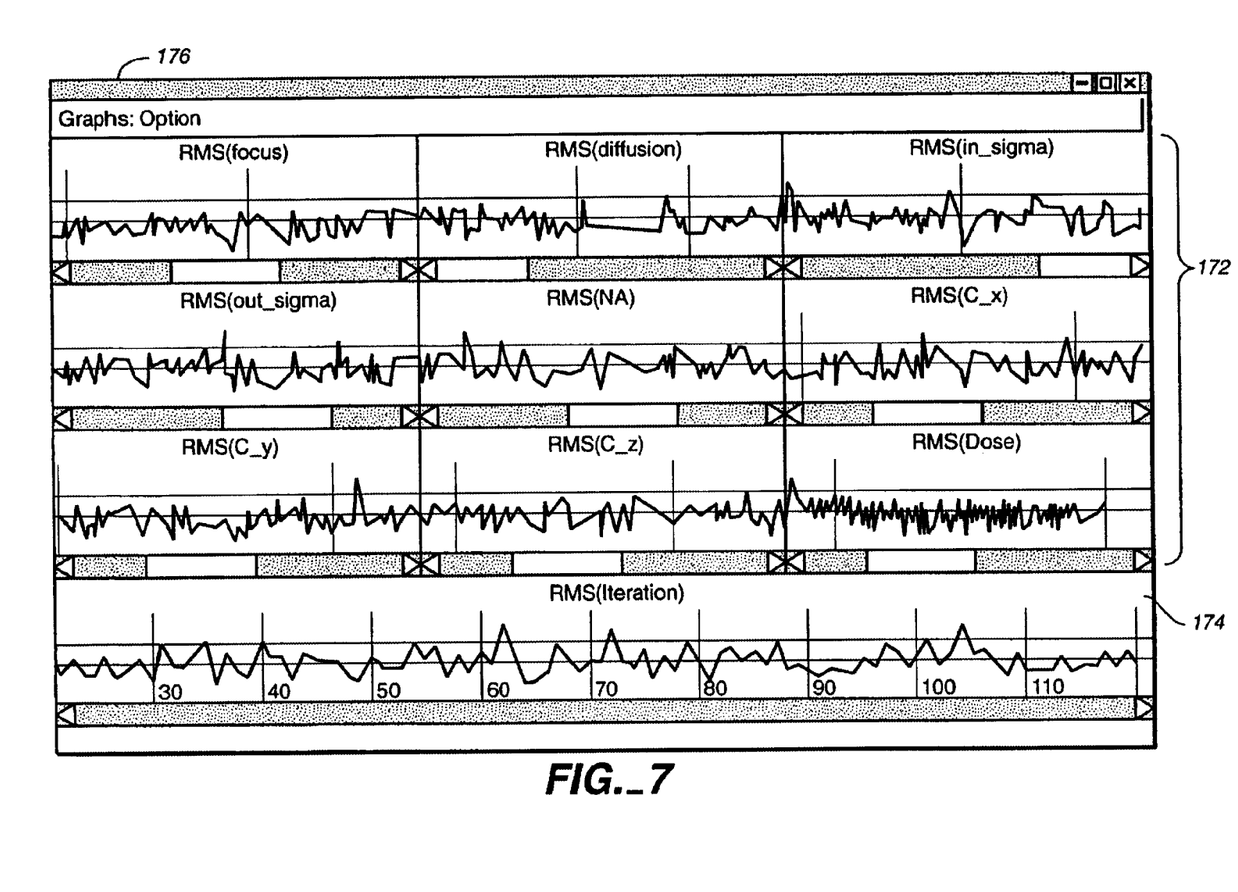
FIG. 7 is a diagram illustrating a user interface screen produced by the calibration program in a preferred embodiment of the present invention.

FIG. 7 is a diagram illustrating a user interface screen produced by the calibration program in a preferred embodiment of the present invention. In a further aspect of the present invention, the calibration program user interface screen 170 displays individual graphs 172 for each processing parameter that plot the parameter values for each iteration along the x-axis, and the resulting RMS distance value along the y-axis. In addition to the individual parameter graphs 172, the user interface screen also displays a global graph 174 plotting the global RMS distance result of each iteration.

A method and system for calibrating a process simulator have been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A computer-implemented method for automatically calibrating a masking process simulator, comprising:
   (a) performing a masking process using a calibration mask and process parameters to produce a calibration pattern on a wafer;
   (b) creating a digital image of the calibration pattern;
   (c) detecting edges of the pattern from the digital image using pattern recognition;
   (d) inputting data defining the calibration mask and at least one of the process parameters into a process simulator to produce an alim image estimating the calibration pattern that would be produced by the masking process;

(e) overlaying the alim image and the detected edges of the digital image;
(f) measuring a distance between contours of the pattern in the alim image and the detected edges; and
(g) using one or more mathematical algorithms to iteratively change values of the at least one processing parameter input to the simulator until a processing parameter value is found that produces a minimum distance between the contours of the pattern in the alim image and the detected edges, thereby effectively calibrating the process simulator to compensate for process variations of the masking process.

2. The method of claim 1 wherein step (b) further includes: using a scanning electron microscope (SEM) to create an SEM image of the calibration pattern.

3. The method of claim 2 wherein step (g) further includes: using multiple processing parameters and changing the values of a subset of the processing parameters.

4. The method of claim 3 wherein the subset of processing parameters includes focus, diffusion, sigma in, sigma out, angle of the pole location, numerical aperture, sigma of the pole, spherical, coma_x, coma_y, and intenstity contour.

5. The method of claim 3 wherein step (g) further includes: receiving from an operator a minimum distance threshold that will be used to terminate a search for the processing parameters, and the minimum and maximum possible values for the processing parameters.

6. The method of claim 5 wherein step (g) further includes:
(i) using a first algorithm to iteratively change the parameter values until a global minimum for a function of the processing parameters is found;
(ii) inputting a first set of calculated parameter values that produced the global minimum to a second algorithm, wherein the second algorithm begins with the function defined by the first set of parameter values and iteratively changes the values of the parameters until local minimums within the function are found, producing a second set of parameter values.

7. The method of claim 6 wherein the first algorithm is a stochastic algorithm.

8. The method of claim 6 wherein step (g) further includes: iteratively inputting the second set of calculated parameter values into the process simulator to generate new alim images for the distance measurement.

9. The method of claim 3 wherein step (c) further includes: correlating the SEM image to the mask design data in order to determine how many pixels in the SEM image are equal to one unit of measure of the mask design.

10. The method of claim 3 wherein step (f) further includes: determining the distance using a distance metric, including root mean square (RMS) algorithm.

11. The method of claim 10 wherein the distance metric measures a distance between at least a subset of each pair of corresponding edges in the alim image and the SEM image and applies a weighted average to the measured distances to produce a single distance value.

12. The method of claim 11 wherein the weighted average is equal to an Nth root of an average Nth power of distance between the SEM edges and the alim image.

13. The method of claim 3 wherein the alim image comprises an aerial image or a latent image.

14. The method of claim 1 further including: displaying a user interface screen that displays a graph for the at least one processing parameter that plots parameter values for each iteration along with resulting distance values, and displays a global graph plotting a global distance result of each iteration.

15. The method of claim 1 wherein the calibration mask is produced by inputting into the masking process global processing parameters, which include both resist parameters for simulating photoresist and optical parameters for simulating optics and characteristics of a stepper machine.

16. A process simulator system, comprising:
a server coupled to a network;
a calibration program executing on the server;
a process simulator executing on the server; and
at least one client computer coupled to the server over the network, such that an operator may access the calibration program, wherein once invoked, the calibration program:
(a) receives a digital image of a calibration pattern on a wafer, the calibration pattern produced during a masking process using a calibration mask and process parameters
(b) detects edges of the pattern from the digital image using pattern recognition;
(c) inputs data defining the calibration mask and at least one of the process parameters into the process simulator, which then produces an alim image estimating the calibration pattern that would be produced by the masking process;
(d) overlays the alim image and the detected edges of the digital image;
(e) measures a distance between contours of the pattern in the alim image and the detected edges; and
(f) uses one or more mathematical algorithms to iteratively change values of the at least one processing parameter input to the simulator until a processing parameter value is found that produces a minimum distance between the contours of the pattern in the alim image and the detected edges, thereby effectively calibrating the process simulator to compensate for process variations of the masking process.

17. The system of claim 16 wherein a scanning electron microscope (SEM) is used to create an SEM image of the calibration pattern.

18. The system of claim 17 wherein multiple processing parameters are used and the mathematical algorithms iteratively change the values of a subset of the processing parameters.

19. The system of claim 18 wherein the subset of processing parameters includes
focus, diffusion, sigma in, sigma out, angle of the pole location, numerical aperture, sigma of the pole, spherical, coma_x, coma_y, and intenstity contour.

20. The system of claim 18 wherein the calibration program receives from the operator a minimum distance threshold that will be used to terminate the search by the mathematical algorithms, and the minimum and maximum possible values for the processing parameters.

21. The system of claim 20 wherein the mathematical algorithms include
(i) a first algorithm for iteratively changing the parameter values until a global minimum for a function of the processing parameters is found; and
(ii) a second algorithm that receives a first set of calculated parameter values that produced the global minimum and begins with a function defined by the first set of parameter values, and iteratively changes the values of the parameters until local minimums within the function are found, producing a second set of parameter values.

22. The system of claim 21 wherein the first algorithm is a stochastic algorithm.

23. The system of claim 21 wherein the calibration program iteratively inputs the second set of calculated parameter values into the process simulator to generate new alim images for the distance measurement.

24. The system of claim 17 wherein the SEM image is correlated to the mask design data in order to determine how many pixels in the SEM image are equal to one unit of measure of the mask design.

25. The system of claim 17 wherein the distance is determined using a distance metric, including a root mean square (RMS) algorithm.

26. The system of claim 25 wherein the distance metric measures a distance between at least a subset of each pair of corresponding edges in the alim image and the SEM image, and applies a weighted average to the measured distances to produce a single distance value.

27. The system of claim 26 wherein the weighted average is equal to an Nth root of an average Nth power of distance between the SEM edges and the alim image.

28. The system of claim 17 wherein the alim image comprises an aerial image or a latent image.

29. The system of claim 16 wherein the calibration program displays a user interface screen that displays individual graphs for each processing parameter that plot parameter values for each iteration along with resulting distance values, and displays a global graph plotting a global distance result of each iteration.

30. The system of claim 16 wherein processing parameters input to the process simulator comprise global processing parameters, which include both resist parameters for simulating photoresist and optical parameters for simulating optics and characteristics of a stepper machine.

* * * * *